United States Patent
Hashimoto

(10) Patent No.: US 12,007,670 B2
(45) Date of Patent: Jun. 11, 2024

(54) ILLUMINATING UNIT

(71) Applicant: FUJI CORPORATION, Chiryu (JP)

(72) Inventor: Mitsuhiro Hashimoto, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 151 days.

(21) Appl. No.: 17/629,764

(22) PCT Filed: Jul. 26, 2019

(86) PCT No.: PCT/JP2019/029472
§ 371 (c)(1),
(2) Date: Jan. 24, 2022

(87) PCT Pub. No.: WO2021/019611
PCT Pub. Date: Feb. 4, 2021

(65) Prior Publication Data
US 2022/0269150 A1    Aug. 25, 2022

(51) Int. Cl.
*G03B 15/00* (2021.01)
*G03B 15/05* (2021.01)

(52) U.S. Cl.
CPC .................. *G03B 15/05* (2013.01)

(58) Field of Classification Search
CPC .................................................. G03B 15/05
See application file for complete search history.

(56) References Cited

U.S. PATENT DOCUMENTS

| | | | | |
|---|---|---|---|---|
| 2007/0262233 | A1* | 11/2007 | Shimokawa | H04N 1/00068 |
| | | | | 250/205 |
| 2013/0241835 | A1* | 9/2013 | Lee | G06F 3/0317 |
| | | | | 345/166 |
| 2019/0149790 | A1* | 5/2019 | Hirasawa | H04N 23/72 |
| | | | | 348/224.1 |
| 2019/0261542 | A1* | 8/2019 | Ito | H05K 13/087 |
| 2020/0221551 | A1* | 7/2020 | Sawanami | G01N 21/95684 |

FOREIGN PATENT DOCUMENTS

JP    11-40983 A    2/1999

OTHER PUBLICATIONS

International Search Report dated Oct. 21, 2019 in PCT/JP2019/029472 filed on Jul. 26, 2019, 2 pages.

* cited by examiner

*Primary Examiner* — Gerald J Sufleta, II
(74) *Attorney, Agent, or Firm* — Oblon, McClelland, Maier & Neustadt, L.L.P.

(57) ABSTRACT

An illuminating unit for illuminating an imaging range of a monochromatic camera mounted on a board work machine for working on a board includes a red light source configured to emit a red light, a green light source configured to emit a green light, a blue light source configured to emit a blue light, and a lighting controller configured to adjust independently respective light amounts of the red light source, the green light source, and the blue light source in the same number of gradations within a predetermined dimming range. In the red light source, the green light source, and the blue light source, the upper limit of the dimming range of the light source having the strong light amount is smaller than the upper limit of the dimming range of the light source having the weak light amount.

4 Claims, 5 Drawing Sheets

ILLUMINATING UNIT

TECHNICAL FIELD

The present description discloses an illuminating unit.

BACKGROUND ART

Conventionally, there has been known a board work machine for working on a board. For example, Patent Literature 1 discloses, as a board work machine, a component mounter including a head configured to move in an X-axis direction and a Y-axis direction to pick up a component, a camera provided on the head to image a board, and a lighting device configured to shine light on a board.

PATENT LITERATURE

Patent Literature 1: JP-A-11-40983

BRIEF SUMMARY

Technical Problem

As a lighting device for illuminating the imaging range of a camera mounted on such a board work machine, there is a lighting device including light sources of lights of red (R), green (G), and blue (B) colors. The board work machine is such that the light sources of the three colors of the lighting device are individually and separately lit up to illuminate a target object accordingly so as to image the target object which is illuminated individually and separately with respective lights from the light sources of the three colors to thereby obtain three monochromatic images as captured images of the target object. Then, with this board work machine, an optimum image is selected from the three monochromatic images, or a composite image is generated from the three monochromatic images, whereby the recognition process (the image processing) of the target object using the captured images can be executed with good precision. However, when the maximum light amounts of the light sources of the three colors vary, light amount resolutions of the light sources of the three colors also become different from one another, whereby the possibility results that the light amounts of the light sources of the three colors become uneven even by executing dimming when the light sources of the three colors are lit up. A sufficient recognition accuracy cannot be secured even by imaging a target object which is illuminated with the lights emitted from the lighting device described above by a camera and executing an image recognition process using a captured image of the target object so obtained.

A principal object of the present disclosure is to provide an illuminating unit by which lights can easily be obtained which are less uneven in light amounts of colored lights involved and are bright enough to meet required brightness therefor.

Solution to Problem

The present disclosure has taken the following means to achieve the principal object described above.

According to a gist of the present disclosure, there is provided an illuminating unit for illuminating an imaging range of a monochromatic camera mounted on a board work machine for working on a board, including:

a red light source configured to emit a red light;
a green light source configured to emit a green light;
a blue light source configured to emit a blue light; and
a lighting controller configured to adjust independently respective light amounts of the red light source, the green light source, and the blue light source in the same number of gradations within a predetermined dimming range, wherein in the red light source, the green light source, and the blue light source, an upper limit of a dimming range of the light source having a strong light amount is smaller than an upper limit of a dimming range of the light source having a weak light amount.

The illuminating unit of the present disclosure includes the lighting controller configured to adjust independently the respective light amounts of the red light source, the green light source, and the blue light source in the same number of gradations within the predetermined dimming range. In the red light source, the green light source, and the blue light source, the upper limit of the dimming range of the light source having the strong light amount is smaller than the upper limit of the dimming range of the light source having the weak light amount. As a result, since the widths of the dimming ranges of the three light sources can be made uniform, the light source resolutions of the three light sources can be made uniform by making identical the numbers of gradations in which the light amounts of the three light sources are adjusted. As a result, an illuminating unit can be provided by which lights can easily be obtained which are less uneven in light amounts of colored lights involved and are bright enough to meet required brightness therefor. Here, the light sources may be light sources made up of LEDs.

DESCRIPTION OF EMBODIMENT

Next, a mode for carrying out the present disclosure will be described.

Figure 1:
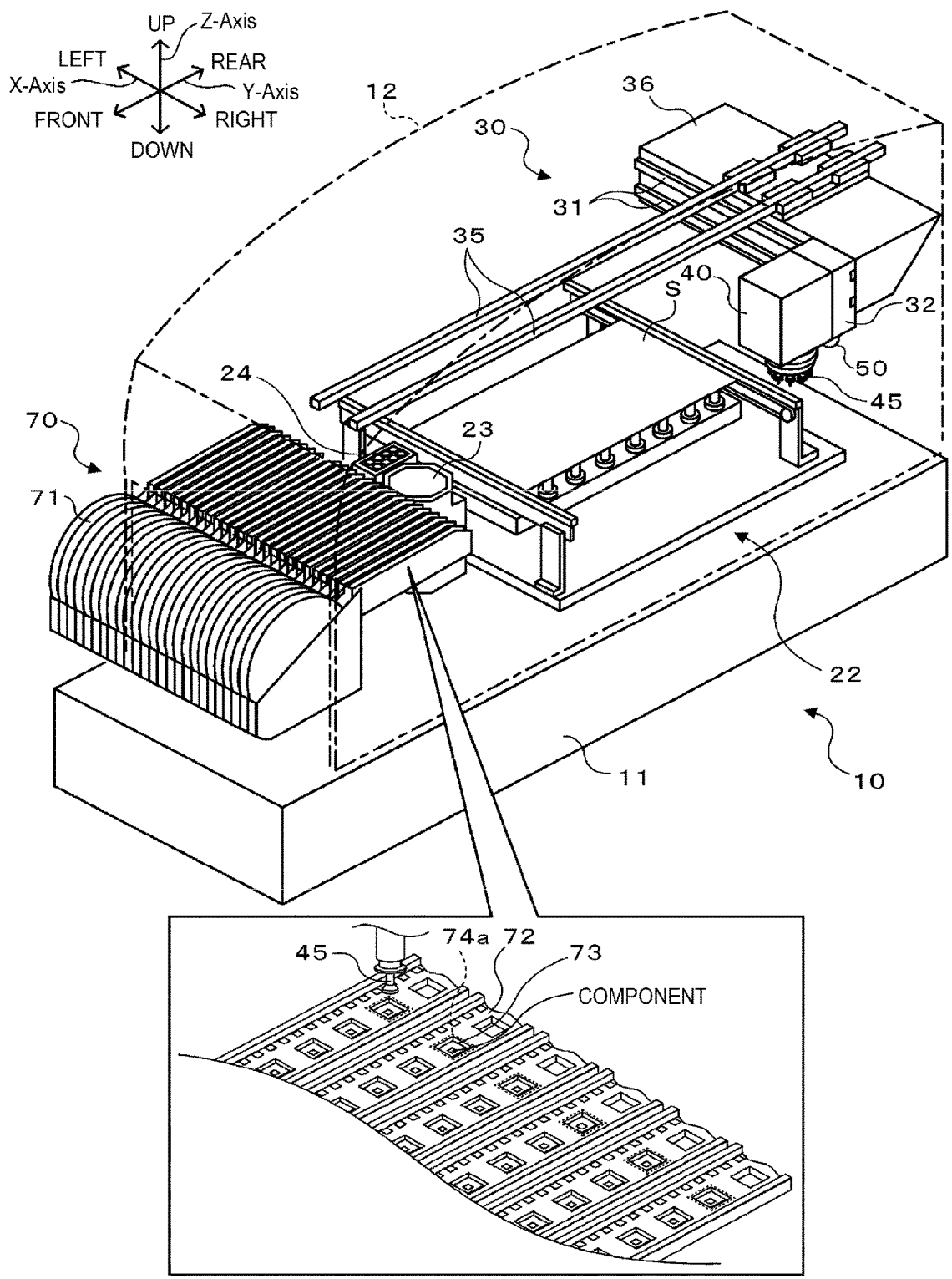
FIG. 1 is a configuration diagram schematically showing the configuration of component mounter 10.
Figure 2:
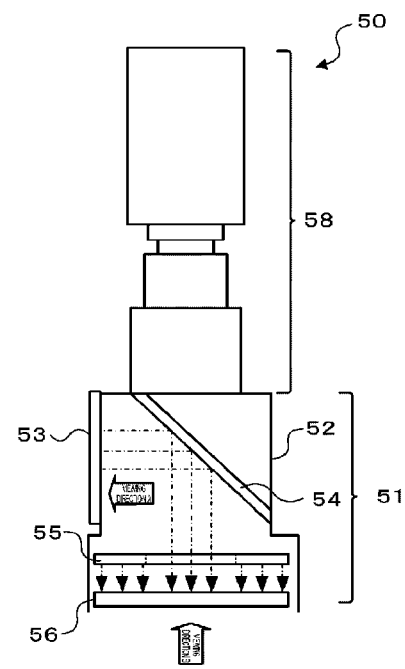
FIG. 2 is a configuration diagram schematically showing the configuration of mark camera 50.
Figure 3:
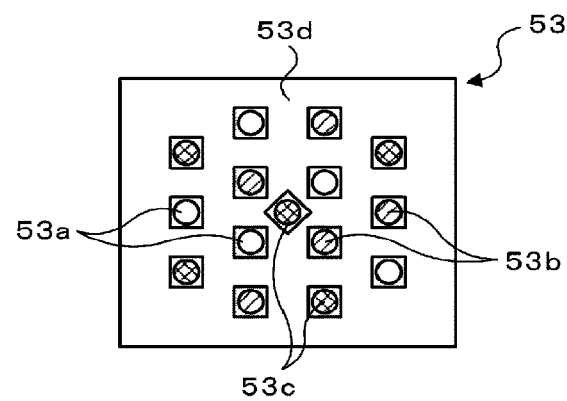
FIG. 3 is a view of epi-illuminating light source 53 as viewed in a direction indicated by an arrow A.
Figure 4:
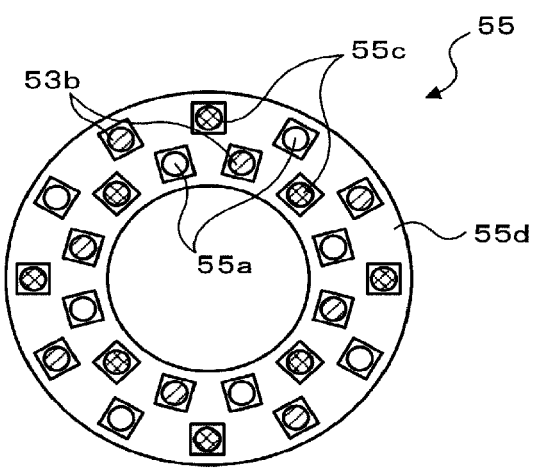
FIG. 4 is a view of side-illuminating light source 55 as viewed in a direction indicated by an arrow B.
Figure 5:
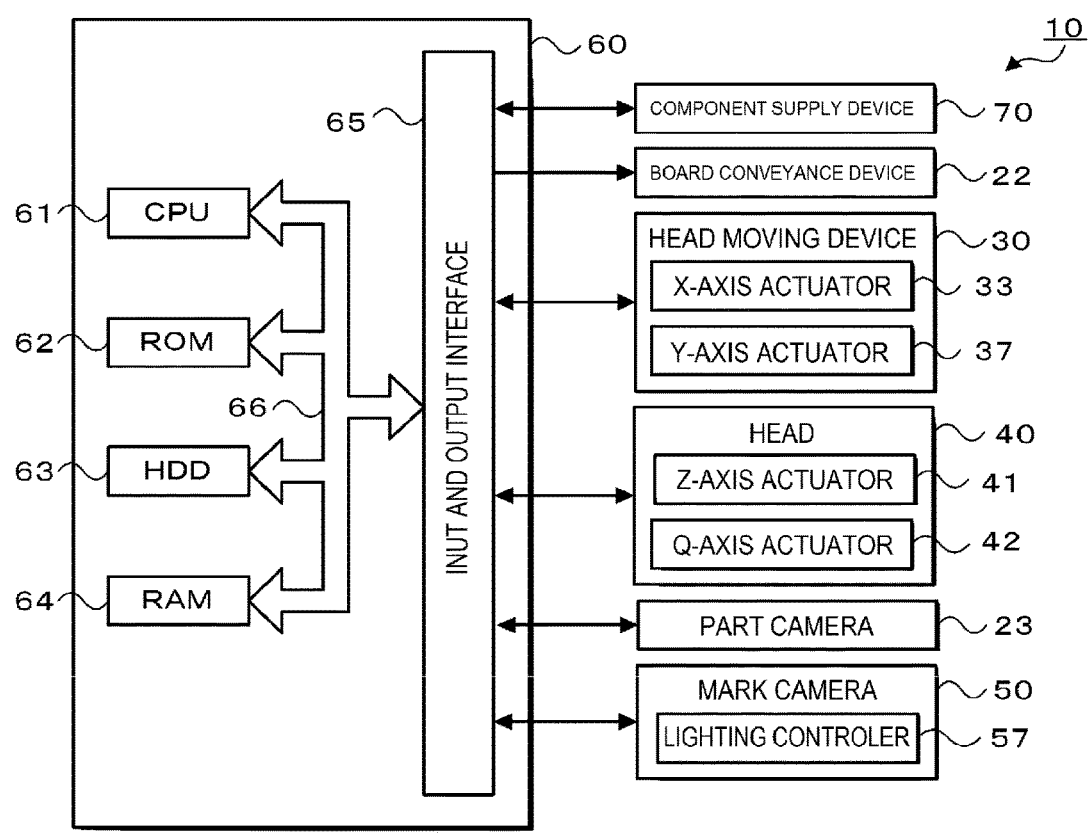
FIG. 5 is a block diagram showing a configuration regarding a control of component mounter 10.

FIG. 1 is a configuration diagram schematically showing the configuration of component mounter 10. FIG. 2 is a configuration diagram schematically showing the configuration of mark camera 50. FIG. 3 is a view of epi-illuminating light source 53 as viewed in a direction indicated by an arrow A. FIG. 4 is a view of side-illuminating light source 55 as viewed in a direction indicated by an arrow B. FIG. 5 is a block diagram showing a configuration regarding a control of component mounter 10. In FIG. 1, a left-right direction denotes an X-axis direction, a front (a near side)-rear (a far side) direction denotes a Y-axis direction, and an up-down direction denotes a Z-axis direction.

As shown in FIG. 1, component mounter 10 includes board conveyance device 22 for conveying board S, head 40 for picking up a component using suction nozzle 45 to mount the component on board S, head moving device 30 for moving head 40 in the X-axis direction and the Y-axis direction, mark camera 50 for imaging board S, and feeder 70 for supplying components to head 40. These constituent elements are accommodated in housing 12 placed on base plate 11. In addition to these constituent elements, component mounter 10 also includes part camera 23 for imaging a component picked up by and held to head 40, nozzle station 24 for accommodating suction nozzles 45 for exchange, and the like. Multiple component mounters 10 are arranged side by side in a board conveyance direction (the X-axis direction) to form a production line.

Board conveyance device 22 is placed on base plate 11. Board conveyance device 22 includes a pair of conveyor rails, which are disposed in such a manner as to be spaced apart from each other in the Y-axis direction to convey board S from the left to the right in FIG. 1 (the board conveyance direction) by driving the pair of conveyor rails.

As shown in FIG. 1, head moving device 30 includes pair of X-axis guide rails 31, X-axis slider 32, X-axis actuator 33 (refer to FIG. 5), pair of Y-axis guide rails 35, Y-axis slider 36, and Y-axis actuator 37 (refer to FIG. 5). Pair of Y-axis guide rails 35 is placed at an upper stage in housing 12 in such a manner as to extend parallel to each other in the Y-axis direction. Y-axis slider 36 spans pair of Y-axis guide rails 35 so as to move in the Y-axis direction along Y-axis guide rails 35 by being actuated by Y-axis actuator 37. Pair of X-axis guide rails 31 is disposed on a front surface of Y-axis slider 36 so as to extend parallel to each other in the X-axis direction. X-axis slider 32 spans pair of X-axis guide rails 31 so as to move in the X-axis direction along X-axis guide rail 31 by being driven by X-axis actuator 33. Head 40 is attached to X-axis slider 32, and head moving device 30 moves head 40 in the X-axis direction and the Y-axis direction by moving X-axis slider 32 and Y-axis slider 36.

Head 40 includes Z-axis actuator 41 (refer to FIG. 3) for moving suction nozzle 45 in the X-axis (up-down) direction and θ-axis actuator 42 (refer to FIG. 3) for rotating suction nozzle 45 around a Z-axis. Head 40 can pick up a component through suction by causing a negative pressure source to communicate with a suction port of suction nozzle 45 so as to apply a negative pressure to the suction port. In addition, head 40 can release a component picked up by and held to the suction port of suction nozzle 45 therefrom by causing a positive pressure source to communicate with the suction port of suction nozzle 45 so as to apply a positive pressure to the suction port. Head 40 may be a head including single suction nozzle 45 or may be a rotary head including multiple suction nozzles 45 which are disposed at equal intervals along an outer circumference of a cylindrical head main body. As a member for holding a component, a mechanical chuck or an electromagnet may be used in place of suction nozzle 45.

Part camera 23 is placed on base plate 11. Part camera 23 images a component picked up and held by suction nozzle 45 from below when the component so held by suction nozzle 45 passes over part camera 23 to thereby generate a captured image of the component and outputs the captured image so generated to control device 60.

Mark camera 50 is attached to X-axis slider 32 and is caused to move in the X-axis direction and the Y-axis direction together with head 40 by head moving device 30. Mark camera 50 images an imaging target object from above to generate a captured image thereof and outputs the captured image of the imaging target object so generated to control device 60. Components held onto tape 72 which is fed out by feeder 70, marks affixed to board S, components which have been mounted on board S, solder which is applied to a circuit wiring printed on board S, and the like are taken as imaging target objects of mark camera 50.

As shown in FIG. 2, mark camera 50 includes lighting device 51, which functions as the illuminating unit of the present disclosure, and camera main body 58. Lighting device 51 includes housing 52, epi-illuminating light source 53, half mirror 54, side-illuminating light source 55, and lighting controller 57 (refer to FIG. 5). Housing 52 is a cylindrical member, which is opened in a lower surface thereof, and is attached to a lower portion of camera main body 58. epi-illuminating light source 53 is provided on an internal side surface of housing 52. As shown in FIG. 3, epi-illuminating light source 53 is such that the same number or substantially the same number of red LEDs 53a for emitting a monochromatic light of red (R), green LEDs 53b for emitting a monochromatic light of green (G), and blue LEDs 53c for emitting a monochromatic light of blue (B) are disposed on a quadrangular support plate 53d. These LEDs 53a to 53c are each such that a hemispherical lens is attached to a quadrangular base on which a light emitting element is disposed at the center thereof in such a manner as to cover the light emitting element. In the present embodiment, as shown in FIG. 3, one of blue LEDs 53c is positioned at the center of the arrangement of the LEDs. This is because the light amount of blue LED 53c is weaker than those of other red LED 53a and green LED 53b. A shortage of light amount in illuminating a target object can be covered to thereby suppress the variability in light amount for each of the colored lights by positioning one of blue LEDs 53c at the center of the arrangement of the LEDs. Half mirror 54 is provided in such a manner as to be oblique inside housing 52. Half mirror 54 reflects horizontal lights from individual LEDs 53a, 53b, 53c of epi-illuminating light source 53 downwards. Half mirror 54 transmits light from below towards camera main body 58. side-illuminating light source 55 is provided in the vicinity of a lower opening of housing 52 in such a manner as to lie horizontal. As shown in FIG. 4, side-illuminating light source 55 is such that the same number or substantially the same number of red LEDs 55a, green LEDs 55b, and blue LEDs 55c are arranged on a ring-shaped support plate 55d and shines light downwards. These LEDs 55a to 55c are each such that a hemispherical lens is attached to a quadrangular base on which a light emitting element is disposed at the center thereof in such a manner as to cover the light emitting element. Diffuse plate 56 is provided below side-illuminating light source 55 in housing 52. Lights emitted from epi-illuminating light source 53 and side-illuminating light source 55 are finally diffused by the diffuse plate 56 and then are shined onto a target object. Lighting controller 57 is, for example, a controller which has independent switching elements individually for LEDs 53a to 53c of epi-illuminating light source 53 and LEDs 55a to 55c of side-illuminating light source 55 and which can independently dim the individual LEDs to a predetermined gradation by switching control of the switching elements using pulse width modulation (PWM). In the present embodiment, lighting controller 57 can adjust the light amount of each LED in 256 gradations by adjusting the duty ratio of the PWM to 256 gradations. Camera main body 58 is a monochromatic camera that generates a monochromatic captured image based on light received thereby. Camera main body 58 includes an optical system such as a lens, not shown, and a monochromatic imaging element (for example, a monochromatic CCD). When lights emitted from epi-illuminating light source 53 and side-illuminating light source 55 and then reflected on a target object pass through half mirror 54 to reach camera main body 58, camera main body 58 receives the lights to generate a captured image of the target object.

Respective wavelength regions of lights of R, G, B are not particularly limited, but, for example, R may range from 590 to 780 nm, G may range from 490 to 570 nm, and B may range from 400 to 490 nm.

Feeder 70 includes reel 71 around which tape 72 is wound and a tape feeding mechanism for unwinding tape 72 from reel 71 to feed tape 72 to component supply position 74a. Multiple accommodation recessed sections 73 are provided in a front surface of tape 72 in such a manner as to be disposed at equal intervals along a longitudinal direction of tape 72. Components are individually accommodated in accommodation recessed sections 73. These components are protected by a film covering the front surface of tape 72. Tape 72 results in a state in which the film is peeled off to expose a component when tape 72 is fed to component supply position 74a. The component fed out to component supply position 74a is then picked up by suction nozzle 45 through suction.

As show in FIG. 5, control device 60 is configured as a microprocessor which is made up mainly of CPU 61 and includes ROM 62, HDD 63, RAM 64, and input and output interface 65 in addition to CPU 61. These constituent elements are electrically connected to one another via bus 66. An image signal from mark camera 50, an image signal from part camera 23, and the like are inputted into control device 60 via input and output interface 65. On the other hand, various signals are outputted from control device 60 to the constituent elements by way of input and output interface 65; for example, a control signal is outputted to board conveyance device 22, a drive signal is outputted to X-axis actuator 33, a drive signal is outputted to Y-axis actuator 37, a drive signal is outputted to Z-axis actuator 41, a drive signal is outputted to θ-axis actuator 42, a control signal is outputted to part camera 23, a control signal is outputted to mark camera 50, and a control signal is outputted to feeder 70 by way of input and output interface 65.

Next, an operation of component mounter 10 of the present embodiment, which is configured as has been described heretofore, will be described as below. First of all, a component mounting process will be described which is executed on board S by component mounter 10 in accordance with a production schedule which component mounter 10 receives from a management device, not shown. CPU 61 of control device 60 of component mounter 10 first causes head moving device 30 to move suction nozzle 45 a position above component supply position 74a of feeder 70 for supplying a component constituting a mounting target. Subsequently, CPU 61 executes a pickup operation in which CPU 61 causes head 40 to make suction nozzle 45 pick up a component. Specifically speaking, the pickup operation is executed so that CPU 61 causes Z-axis actuator 41 to be driven to lower suction nozzle 45 until a distal end (a suction port) of suction nozzle 45 is brought into abutment with a component and causes a negative pressure to act on the suction port of suction nozzle 45. Then, CPU 61 causes head moving device 30 to move suction nozzle 45 so that the component picked up and held by suction nozzle 45 reaches a position above part camera 23, then causes part camera 23 to image the component there-above, and recognizes an orientation of the component based on a captured image of the component so obtained. Next, CPU 61 calculates a pickup deviation amount based on the orientation of the component so recognized, corrects a mounting position based on the pickup deviation amount so calculated, and causes head moving device 30 to move the component picked up and held by suction nozzle 45 so as to reach a position above the mounting position on board S. Then, CPU 61 executes a mounting operation in which CPU 61 causes head 40 to mount the component in the mounting position on board S. Specifically speaking, the mounting operation is executed so that CPU 61 causes Z-axis actuator 41 to be driven to lower suction nozzle 45 until the component picked up and held by suction nozzle 45 is brought into abutment with board S and causes a positive pressure to act on the suction port of suction nozzle 45. CPU 61 repeatedly executes the component mounting process described above to thereby mount components of predetermined numbers and types on board S. In the present embodiment, a production line is made up of multiple component mounters 10 which are arranged side by side in the board conveyance direction. As a result, it is designed that when board S is conveyed from an upstream-most component mounter 10 to a downstream-most component mounter 10 of the production line, all predetermined components are mounted on board S.

In the present embodiment, in component mounter 10, when a component is mounted on board S, that board S is imaged by mark camera 50, and a mounting inspection is executed to see whether the component is mounted on board S properly based on a captured image of that board S so obtained. The mounting inspection may be executed, for example, so that an image processing for recognizing the component is executed on the captured image, whereby the component is determined to have been mounted properly on the board when the recognition of the component is successful, while when the recognition of the component fails, the component is determined not to have been mounted properly on the board. In addition, the mounting inspection may be executed so that a mounting deviation amount (a positional deviation amount or a rotational deviation amount) of the component relative to the board is calculated from the recognition result of recognition of the component, whereby the component is determined to have been mounted properly on the board when the mounting deviation amount so calculated falls within a permissible range, while when the calculated mounting deviation amount exceeds the permissible range, the component is determined not to have been mounted properly on the board. The imaging of board S is executed so that control device 60 of component mounter 10 transmits a lighting command to lighting controller 57 of lighting device 51 and lighting controller 57 lights up the corresponding LEDs in accordance with the lighting command which lighting controller 57 receives and executes a photoelectric conversion on the light which camera main body 58 receives to generate a captured image of board S.

Figure 6:
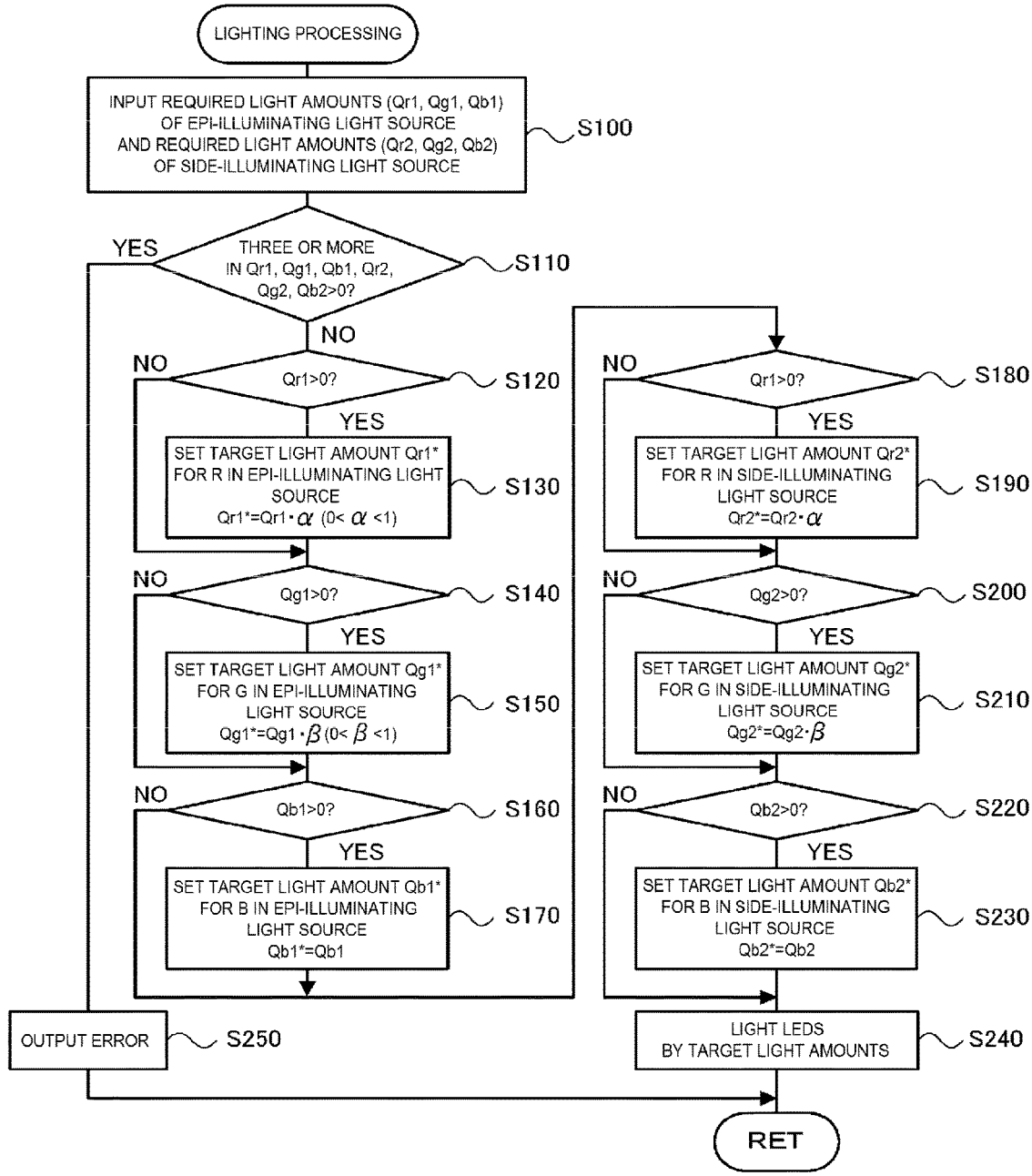
FIG. 6 is a flowchart illustrating an example of a lighting process.

Next, an operation of lighting controller 57 will be described which receives the lighting command. FIG. 6 is a flowchart showing an example of lighting processing executed by lighting controller 57. First of all, lighting controller 57 inputs respective required light amounts (Qr1, Qg1, Qb1) of LEDs 53a to 53c of epi-illuminating light source 53 and respective required light amounts (Qr2, Qg2, Qb2) of LEDs 55a to 55c of side-illuminating light source 55 (step S100). Here, the input of the required light amounts is executed so that predetermined required light amounts for an imaging target or imaging conditions are inputted from control device 60 of component mounter 10.

Subsequently, lighting controller 57 determines whether three or more required light amounts in those required light amounts Qr1, Qg1, Qb1, Qr2, Qg2, Qb2 so inputted are larger than a value 0, that is, whether three or more LEDs in those LEDs 53a to 53c, 55a to 55c have been given a lighting command (step S110). If an affirmative determination is made in step S110, lighting controller 57 outputs an error to control device 60 of component mounter 10 without lighting up the LEDs (step S250) and ends this processing. In the present embodiment, simultaneous lighting of three or more systems is not permitted due to a limitation being imposed on a supply current. As a result, when lighting controller 57 receives a command to light up three or more LEDs simultaneously from control device 60 of component mounter 10 for some reason such as some abnormality, lighting controller 57 returns an error to control device 61 without lighting up the LEDs, whereby an erroneous lighting of the LEDs is prevented.

If a negative determination is made in step S110, lighting controller 57 determines whether required light amount Qr1 of red LED 53a of epi-illuminating light source 53 is larger than the value 0 (step S120). If lighting controller 57 determines that required light amount Qr1 of red LED 53a is not larger than the value 0, lighting controller 57 proceeds to step S140, while if lighting controller 57 determines that required light amount Qr1 is larger than the value 0, lighting controller 57 sets target light amount Qr1* for red LED 53a (step S130) and proceeds to step S140. The setting of target light amount Qr1* is executed so that a value resulting from multiplying required light amount Qr1 by adjustment coefficient α which is larger than the value 0 and smaller than a value 1 is set to target light amount Qr1*. Adjustment coefficient α will be described in detail later.

Subsequently, lighting controller 57 determines whether required light amount Qg1 of green LED 53b of epi-illuminating light source 53 is larger than the value 0 (step S140). If lighting controller 57 determines that required light amount Qg1 is not larger than the value 0, lighting controller 57 proceeds to step S160, while if lighting controller 57 determines that required light amount Qg1 is larger than the value 0, lighting controller 57 sets target light amount Qg1* for green LED 53b (step S150) and then proceeds to step S160. The setting of target light amount Qg1* is executed so that a value resulting from multiplying required light amount Qg1 by adjustment coefficient β which is larger than the value 0 and smaller than the value 1 is set to target light amount Qg1*. Adjustment coefficient β will be described in detail later.

Then, lighting controller 57 determines whether required light amount Qb1 of blue LED 53c of epi-illuminating light source 53 is larger than the value 0 (step S160). If lighting controller 57 determines that required light amount Qb1 is not larger than the value 0, lighting controller 57 proceeds to step S180, while if lighting controller 57 determines that required light amount Qb1 is larger than the value 0, lighting controller 57 sets target light amount Qb1* of blue LED 53c (step S170) and proceeds to step S180. The setting of target light amount Qb1* is executed so that lighting controller 57 sets required light amount Qb1 to target light amount Qb1* as it is.

Next, lighting controller 57 determines whether required light amount Qr2 of red LED 55a of side-illuminating light source 55 is larger than the value 0 (step S180). If lighting controller 57 determines that required light amount Qr2 is not larger than the value 0, lighting controller 57 proceeds to step S200, while if lighting controller 57 determines that required light amount Qr2 is larger than the value 0, lighting controller 57 sets target light amount Qr2* of red LED 55a (step S190) and proceeds to step S200. The setting of target light amount Qr1* is executed so that lighting controller 57 sets a value resulting from multiplying required light amount Qr2 by the adjustment coefficient α to target light amount Qr1*.

Subsequently, lighting controller 57 determines whether required light amount Qg2 of green LED 55b of side-illuminating light source 55 is larger than the value 0 (step S200). If lighting controller 57 determines that required light amount Qg2 is not larger than the value 0, lighting controller 57 proceeds to step S220, while if lighting controller 57 determines that required light amount Qg2 is larger than the value 0, lighting controller 57 sets target light amount Qg2* of green LED 55b (step S210) and proceeds to step S220. The setting of target light amount Qg2* is executed so that lighting controller 57 sets a value resulting from multiplying required light amount Qg2 by the adjustment coefficient β to target light amount Qg2*.

Then, lighting controller 57 determines whether required light amount Qb2 of blue LED 55c of side-illuminating light source 55 is larger than the value 0 (step S220). If lighting controller 57 determines that required light amount Qb2 is not larger than the value 0, lighting controller 57 proceeds to step S240, while if lighting controller 57 determines that required light amount Qb2 is larger than the value 0, lighting controller 57 sets target light amount Qb2* of blue LED 55c (step S230) and proceeds to step S240. The setting of target light amount Qb2* is executed so that lighting controller 57 sets required light amount Qb2 to target light amount Qb2* as it is.

Figure 7:
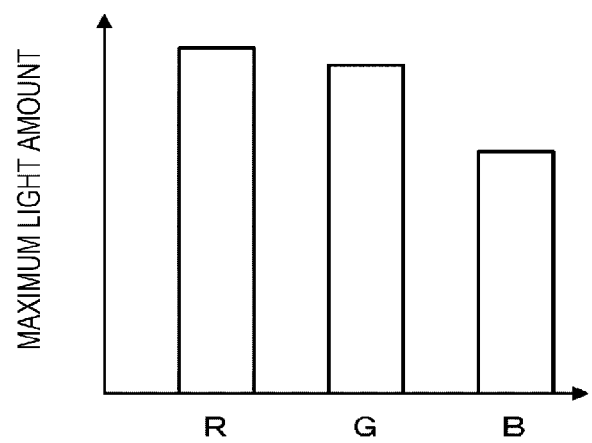
FIG. 7 is an explanatory diagram showing respective maximum light amounts of LEDs of three colors.
Figure 8:
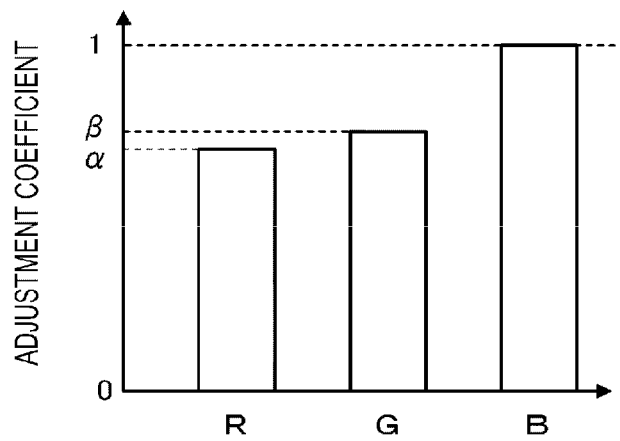
FIG. 8 is an explanatory diagram showing upper limits of respective dimming ranges of the LEDs of the three colors.

FIG. 7 is an explanatory diagram showing respective maximum light amounts of the LEDs of the three colors. FIG. 8 is an explanatory diagram showing upper limits of respective dimming ranges of the LEDs of the three colors. As shown in FIG. 7, in the present embodiment, in LEDs 53a to 53c and LEDs 55a to 55c of epi-illuminating light source 53 and side-illuminating light source 55, respectively, maximum light amounts of red LEDs 53a, 55a are the largest, and maximum light amounts of blue LEDs 53c, 55c are the smallest. As a result, when the numbers of gradations of the light amounts of individual LEDs 53a to 53c, 55a to 55c are made the same and all the upper limits of the dimming ranges are made 100%, respective light amount resolutions of the three colors vary, resulting in the possibility that light of required brightness cannot be obtained depending on the colors. Then, in the present embodiment, in the LEDs of the three colors, the upper limits of the dimming ranges of the LEDs (red LEDs 53a, 55a and green LEDs 53b, 55b) whose light amounts are strong are limited so that the amounts of light emitted from those LEDs 53a to 53c, 55a to 55c are made the same at the upper limits of the dimming ranges. That is, required light amounts Qb1, Qb2 are set as they are to target light amounts Qb1*, Qb2* of blue LEDs 53c, 55c, respectively. As a result, as shown in FIG. 8, the upper limits of the dimming ranges of blue LEDs 53c, 55c become 100%. In addition, values resulting from multiplying required light amounts Qr1, Qr2 by adjustment coefficient α, which is larger than the value 0 and smaller than the value 1, are set to target light amounts Qr1*, Qr2* of red LEDs 53a, 55a, respectively. Values resulting from multiplying required light amounts Qg1, Qg2 by adjustment coefficient β, which is larger than the value 0 and smaller than the value 1, are set to target light amounts Qg1*, Qg2* of green LEDs 53b, 55b, respectively. As a result, as shown in FIG. 8, the upper limits of the dimming ranges of red LEDs 53a, 55a and green LEDs 53b, 55b are limited to values smaller than 100% by those adjustment coefficients α, β, respectively. As a result, since the widths of the dimming ranges of the three light sources can be made uniform, the light source resolutions of the three light sources can be made uniform by making identical the numbers of gradations in which the light amounts of the three light sources are adjusted. As a result, lights can easily be obtained which are less uneven in light amounts of the three colors and are bright enough to meet the required brightnesses therefor.

If lighting controller 57 sets any one of target light amounts Qr1*, Qg1*, Qb1*, Qr2*, Qg2*, Qb2* of LEDs 53a to 53c, 55a to 55c in the manner that has been described heretofore, lighting controller 57 executes a lighting control (a PWM control) so that a corresponding LED is lit up based on the target light amount so set (step S240) and ends the present processing.

Here, the correspondence between the principal elements of the embodiment and the principal elements described in the present disclosure will be described. That is, mark camera 50 corresponds to the imaging device, and control device 60 corresponds to the image processing device.

It goes without saying that the present disclosure is not limited to the embodiment that has been described heretofore in any way and hence can be carried out in various aspects without departing from the technical scope of the present disclosure.

For example, board S is described as constituting a target object in the embodiment described above; however, a configuration may be adopted in which a component accommodated in accommodation recessed section 73 in tape 72 of feeder 70 constitutes a target object and is illuminated by lighting device 51. In addition, a tray unit for supplying components mounted on trays may be adopted as the component supply device of component mounter 10 in place of feeder 70, in which case a component mounted on a tray may constitute a target object which is illuminated by lighting device 51.

Component mounter 10 is illustrated as the board work machine in the embodiment described above; however, the present disclosure is not particularly limited thereto, and hence, for example, the board work machine may be a printer disposed upstream of a production line in which multiple component mounters 10 are arranged side by side. The printer is a device for printing (applying) solder on a circuit wiring of a board before a component is mounted thereon. In this case, the solder so applied may constitute a target object which is illuminated by lighting device 51.

Lighting device 51 is described as including epi-illuminating light source 53 and side-illuminating light source 55 in the embodiment described above; however, lighting device 51 may include only either of the two light sources.

As has been described heretofore, according to a gist of the present disclosure, there is provided an illuminating unit for illuminating an imaging range of a monochromatic camera mounted on a board work machine for working on a board, including a red light source configured to emit a red light,
   a green light source configured to emit a green light, a blue light source configured to emit a blue light, and a lighting controller configured to adjust independently respective light amounts of the red light source, the green light source, and the blue light source in the same number of gradations within a predetermined dimming range, wherein in the red light source, the green light source, and the blue light source, an upper limit of a dimming range of the light source having a strong light amount is smaller than an upper limit of a dimming range of the light source having a weak light amount.

The illuminating unit of the present disclosure includes the lighting controller configured to adjust independently the respective light amounts of the red light source, the green light source, and the blue light source in the same number of gradations within the predetermined dimming range. In the red light source, the green light source, and the blue light source, the upper limit of the dimming range of the light source having the strong light amount is smaller than the upper limit of the dimming range of the light source having the weak light amount. As a result, since the widths of the dimming ranges of the three light sources can be made uniform, the light source resolutions of the three light sources can be made uniform by making identical the numbers of gradations in which the light amounts of the three light sources are adjusted. As a result, an illuminating unit can be provided by which lights can easily be obtained which are less uneven in light amounts of colored lights involved and are bright enough to meet required brightnesses therefor. Here, the light sources may be light sources made up of LEDs.

In the illuminating unit of the present disclosure, a configuration may be adopted in which in the red light source, the green light source, and the blue light source, an upper limit of a dimming range of a light source having a weakest light amount is 100%, and an upper limit of a dimming range of another light source which differs from the light source having the weakest light amount is smaller than 100%. The upper limit of the dimming range of the light source having the weakest light amount is set to 100%, and the upper limits of the dimming ranges of the other light sources are determined based on a maximum light amount of the light source having the weakest light amount, whereby the light sources are allowed to exhibit their performances sufficiently while making the respective light amounts of the light sources of the three colors less uneven.

In the illuminating unit of the present disclosure, a configuration may be adopted in which the red light source, the green light source, and the blue light source are each disposed in a multiple number on an identical plane in such a manner as to shine lights towards a target object from an identical direction to an optical axis of a lens of the camera, and in the red light sources, the green light sources, and the blue light sources, one of the light sources having a weakest light amount is provided at a central portion of a disposition of the red light sources, the green light sources, and blue light sources on the plane. Positioning one of the light sources having the weakest light amount at the center of the disposition of the light sources can cover a shortage of light amount in illuminating a target object and suppress the variability in illumination by the lights of the three colors.

Further, in the illuminating unit of the present disclosure, a configuration may be adopted in which the lighting controller receives a lighting command inputted thereinto for each light source from a control device of the board work machine to execute a lighting control to light up the light source matching the lighting command so inputted in the red light source, the green light source, and the blue light source, and when receiving a lighting command inputted thereinto to light up three or more light sources simultaneously, the lighting controller outputs an error without executing the lighting control. As a result, even though a lighting command is individually inputted for three or more light sources for some reason such as some abnormality, this can be dealt with properly through simple processing.

The present disclosure has been described employing the form of the illuminating unit for illuminating the imaging range of the monochromatic camera mounted on the board work machine; however, the present disclosure may adopt a form of a board work machine including an imaging device including an illuminating unit and configured not only to work on a board but also to execute an inspection based on a captured image of a target object which is captured by the imaging device.

INDUSTRIAL APPLICABILITY

The present disclosure can be applied to a manufacturing industry of illuminating units and board work machines.

REFERENCE SIGNS LIST 10 component mounter, 11 housing, 22 board conveyance device, 23 part camera, 24 nozzle station, 30 head moving device, 31 X-axis guide rail, 32 X-axis slider, 33 X-axis actuator, 35 Y-axis guide rail, 36 Y-axis slider, 37 Y-axis actuator, 40 head, 41 Z-axis actuator, 42 θ-axis actuator, 45 suction nozzle, 50 mark camera, 51 lighting device, 52 housing, 53 epi-illuminating light source, 53a red LED, 53b green LED, 53c blue LED, 53d support plate, 54 half mirror, 55 side-illuminating light source, 55a red LED, 55b green LED, 55c blue LED, 55d support plate, 56 diffuse plate, 57 lighting controller, 58 camera main body, 60 control device, 61 CPU, 62 ROM, 63 HDD, 64 RAM, 65 input and output interface, 66 bus, 70 feeder, 71 reel, 72 tape, 73 accommodation recessed section, S board

The invention claimed is:

1. An illuminating unit for illuminating an imaging range of a monochromatic camera mounted on a board work machine for working on a board, comprising:
   a red light source configured to emit a red light;
   a green light source configured to emit a green light;
   a blue light source configured to emit a blue light; and
   a lighting controller configured to adjust independently respective light amounts of the red light source, the green light source, and the blue light source, wherein
   a first target light amount of only one of the red light source, the green light source, and the blue light source is multiplied by a dimming coefficient a to obtain a first dimming range,
   a second target light amount of only one of the red light source, the green light source, and the blue light source is multiplied by a dimming coefficient β to obtain a second dimming range,
   a target light amount of only one of the red light source, the green light source, and the blue light source is multiplied by a dimming coefficient γ to obtain a third dimming range,
   $\alpha<\gamma$ and $\beta<\gamma$, and
   the lighting controller adjusts the respective light amounts of the red light source, the green light source, and the blue light source a same number of graduations within the first dimming range, the second dimming range, and the third dimming range.

2. The illuminating unit according to claim 1, wherein
   $\gamma=1$,
   $0<\alpha<1$, and
   $0<\beta<1$.

3. The illuminating unit according to claim 1,
   wherein the red light source, the green light source, and the blue light source are each disposed in a multiple number on an identical plane in such a manner as to shine lights towards a target object from an identical direction to an optical axis of a lens of the monochromatic camera, and
   wherein the one of the red light source, the green light source, and the blue light source multiplied by the dimming coefficient γ is provided at a central portion of a disposition of the red light source, the green light source, and blue light source on the plane.

4. The illuminating unit according to claim 1,
   wherein the lighting controller receives a first lighting command inputted thereinto for each light source from a control device of the board work machine to execute a lighting control to light up at least one light source matching the lighting command so inputted in the red light source, the green light source, and the blue light source, and when receiving a second lighting command inputted into the light controller to light up three or more light sources simultaneously, the lighting controller outputs an error without executing the second lighting command.

* * * * *